United States Patent
Li et al.

(10) Patent No.: US 7,611,913 B2
(45) Date of Patent: Nov. 3, 2009

(54) FERROELECTRIC RARE-EARTH MANGANESE-TITANIUM OXIDES

(75) Inventors: Yi-Qun Li, Walnut Creek, CA (US); Young Yoo, Moraga, CA (US); Qizhen Xue, Walnut Creek, CA (US); Ning Wang, Martinez, CA (US); Daesig Kim, Pleasanton, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 11/821,244

(22) Filed: Jun. 22, 2007

(65) Prior Publication Data

US 2007/0249066 A1      Oct. 25, 2007

Related U.S. Application Data

(62) Division of application No. 10/934,773, filed on Sep. 3, 2004, now Pat. No. 7,250,648.

(60) Provisional application No. 60/500,972, filed on Sep. 4, 2003.

(51) Int. Cl.
*H01L 21/00*       (2006.01)

(52) U.S. Cl. .............................. 438/3; 438/97; 438/240; 257/295; 257/E27.104; 257/E29.164

(58) Field of Classification Search .................. 438/3, 438/240, 97; 257/295, E27.104, E29.164
See application file for complete search history.

(56) References Cited

U.S. PATENT DOCUMENTS

| | | | |
|---|---|---|---|
| 5,138,520 A * | 8/1992 | McMillan et al. | 361/311 |
| 5,418,389 A | 5/1995 | Watanabe | |
| 5,919,515 A * | 7/1999 | Yano et al. | 427/126.3 |
| 6,376,090 B1 | 4/2002 | Kijima | |
| 6,610,548 B1 | 8/2003 | Ami et al. | |
| 6,740,261 B1 | 5/2004 | Ogata et al. | |
| 6,897,174 B2 * | 5/2005 | Chen et al. | 501/152 |
| 2002/0177243 A1 * | 11/2002 | Matsuura et al. | 438/3 |
| 2003/0173601 A1 | 9/2003 | Machida et al. | |

* cited by examiner

*Primary Examiner*—William M. Brewster
*Assistant Examiner*—Wilner Jean Baptiste
(74) *Attorney, Agent, or Firm*—Quine Intellectual Property Law Group; Gary Baker

(57) ABSTRACT

Ferroelectric rare-earth manganese-titanium oxides and methods of their manufacture. The ferroelectric materials can provide nonvolatile data storage in rapid access memory devices.

18 Claims, 9 Drawing Sheets

FERROELECTRIC RARE-EARTH MANGANESE-TITANIUM OXIDES

CROSS-REFERENCE TO RELATED APPLICATIONS

This application is a Divisional application and claims priority from, and benefit of, a prior U.S. application Ser. No. 10/934,773, "Ferroelectric Rare-Earth Manganese-Titanium Oxides" by Yi-Qun Li, et al., filed Sep. 3, 2004, which claims benefit of a U.S. provisional application No. 60/500,972, "Ferroelectric Rare-Earth Manganese-Titanium Oxides" by Yi-Qun Li, et al., filed Sep. 4, 2003.

FIELD OF THE INVENTION

This invention relates to new metal oxide materials with ferroelectric properties. Compositions of the invention typically include rare-earth manganese-titanium oxides useful in ferroelectric nonvolatile memory devices.

BACKGROUND OF THE INVENTION

Ferroelectric nonvolatile memories have been attractive because they can have performance advantages over current memories such as DRAM, $E^2$PROM, and flash. For example, ferroelectric nonvolatile memories can have higher write endurance, lower write voltage, lower power consumption, and enhanced radiation-hardness.

Ferroelectric properties are thought to result from noncentral symmetric arrangement of ions a crystal unit cell, which produces an electric dipole moment. Titinates such as $BaTiO_3$ and $PbTiO_3$ are typical ferroelectric materials exhibiting ferroelectricity with Ti off-center in a perovskite unit cell. Among the many different ferroelectric materials, $Pb(ZrTi)O_3$ (PZT) with a Zr to Ti ratio of between 0.4 to 0.7 are perhaps the most commonly used in a variety of applications. Their use in nonvolatile memory devices was made practical by introduction of oxide intermediate layers between PZT and Pt electrodes to solve a fatigue problem. However, the memory density of such ferroelectric memories is still limited by the incompatibility of PZT deposition processes with silicon semiconductors. Lead and lead oxides found in PZT materials pose additional problems as a choice in the memory device industry due to environmental concerns.

$SrBi_2Ta_2O_9$ (SBT) ferroelectric materials are reduced fatigue and lead free compositions that have been considered for use in ferroelectric memories. However, SBT requires an undesirably high deposition temperature ranging from about 750° C. to 800° C. Furthermore, the current SBT high density FeRAM (with 1T1C or 2T2C structures) is not a desirable material for mainstream memory chips due to large chip size and high manufacturing costs.

Recently, a single transistor memory cell (ferroelectric-gate FET) has been successfully demonstrated by COVA Technologies. The one transistor (1T) memory cell is expected to considerably reduce cell area, possibly making FeRAM cost competitive. Metal ferroelectric insulator semiconductor (MFIS) 1T cell structures can be preferred due to their simpler structure and manufacturing processes. MFIS buffer layers can be desirable because they provide low interface states and a good interface with silicon. However, insertion of a MFIS buffer layer can also have undesirable effects, such as, e.g., a shortened data retention period and low operational voltage drops in the buffer layer. Therefore, when using MFIS buffer layers, the ratio of dielectric constants between the gate-ferroelectric and buffer dielectric layer ($\in f/\in b$) should be low enough for applied voltage not to drop over the barrier layer during low voltage operation.

The $YMnO_3$ family has a favorably low dielectric constant and has been considered for use in MFIS ferroelectric switching devices. However, such materials have not provided good ferroelectric properties in their thin film forms, even though they show acceptable ferroelectric properties in their single crystal forms. One problem might be that the mixed valence of Mn+2, Mn+3 and Mn+4 in the $YMnO_3$ thin films can cause a serious electrical leakage when provided as a capacitor material.

In view of the above, a need exists for a stable ferroelectric material with a low dielectric constant and low leakage. It would be desirable to have ferroelectric materials requiring relatively low processing temperatures and without toxic metal constituents. The present invention provides these and other features that will be apparent upon review of the following.

SUMMARY OF THE INVENTION

The present invention provides ferroelectric materials and methods of their production. The ferroelectric materials can be, e.g., oxides on manganese and rare-earth metals in crystalline structures exhibiting an electric dipole moment. The ferroelectric materials can be prepared, e.g., by forming one or more layers having certain molar proportions of manganese and rare-earth metal on a substrate, and heating in a low pressure atmosphere to form a thin film material containing ferroelectric crystals.

The ferroelectric material can have constituents described by the formula: $(Y_{1-x}A_x)(Mn_{1-y}B_y)O_3$, where A is a metal having a valence of 3 and $0<x<1$, and B is a metal having a valence of 4 or 3, and $0<y<1$. "A" is typically a rare-earth metal, such as, e.g., Sc, Bi, Ce, Yb, Er, Lu, and the like. "B" can be, for example, Ti, Cr, V, and the like, with "y" typically ranging from about 0.005 to about 1.0, or from about 0.35 to about 0.65. The ferroelectric material is typically grown at thickness between about 500 angstroms (Å) and 3000 Å on a substrate, such as Si, Ge, GaAs, GaN, Al2O3, SiC, AlN, or the like. Often, the material is grown on a portion of the substrate electroded with an inert metal electrode, comprising, e.g., Pt, Au, Al or Ru.

The ferroelectric material can be prepared to have characteristics useful in a variety of electronic devices. For example, layer formulations and crystal growth conditions can be selected to provide ferroelectric materials having high remnant polarization (Pr) values (>1 uC/cm2) for use in ferroelectric memory devices. The ferroelectric material can be prepared to have relatively high or low dielectric constants., as required. In many embodiments, the ferroelectric materials are prepared with a dielectric constant greater than 1, or from about 5 to about 20. The ferroelectric materials can be prepared to be functionally incorporated into various electronic devices, such as, e.g., FeRAMs, nonvolatile memories, ferroelectric-gate FETs, MFISs, and the like.

Methods of preparing the ferroelectric materials generally include depositing metal in proportions according to a formula to form a layer on a substrate, and heating the layer in the presence of a low pressure atmosphere to grow ferroelectric crystals on the substrate. The crystal growth is typically epitaxial to the substrate and can result in polarized dipole orientations. The methods can include, e.g., forming layers of Yttrium, A metal, Mn, and B metal on a substrate in a proportion according to the formula $(Y_{1-x}A_x)(Mn_{1-y}B_y)$, where the A metal has a valence of 3 and $0<x<1$, and where B metal is a metal having a valence of 4 or 3 and $0<y<1$; heating the substrate (and layers) to a temperature ranging from about 600° C. to about 800° C. in a low pressure atmosphere of about $10^{-3}$ torr or less in the presence of oxygen to form ferroelectric crystals in a thin film of ferroelectric material. In certain embodiments, the formed layer has the formula $Y(Mn_{1-y}Ti_y)O_3$ wherein y ranges from about 0.1 to about 1, or from about 0.35 to about 0.65.

The formulated layer of metals (typically in the form of their oxides) can be formed by any deposition methods known in the art, such as, e.g., ion beam sputtering, metal organic chemical vapor deposition (MOCVD), molecular beam epitaxy (MBE), pulsed laser deposition (PLD), magnetron sputtering, electron beam (EB) deposition, and the like. Deposition can be onto a substrate, such as Si, Ge, GaAs, GaN, Al2O3, SiC or AlN, with or without an inert metal electrode.

The deposited formulation layer can be held in atmospheres at temperatures, e.g., conducive to growth of uniformly oriented crystals having ferroelectric qualities. For example, the formulation layer can be exposed to a temperature of about 650° C., in an atmosphere of argon (Ar) and oxygen (O2) in a ratio less than about 1:1 at a pressure of $10^{-4}$ atmospheres or less. In certain embodiments, crystallization is epitaxial in an (0004) orientation to the substrate. Optionally, after about an hour or more of crystal growth, the crystallized layers of ferroelectric material can be post-annealed at a temperature of the in vacuum of about $10^{-6}$ atmospheres or less.

DEFINITIONS

Unless otherwise defined herein or below in the remainder of the specification, all technical and scientific terms used herein have meanings commonly understood by those of ordinary skill in the art to which the present invention belongs.

Before describing the present invention in detail, it is to be understood that this invention is not limited to particular devices or biological systems, which can, of course, vary. It is also to be understood that the terminology used herein is for the purpose of describing particular embodiments only, and is not intended to be limiting. As used in this specification and the appended claims, the singular forms "a", "an" and "the" include plural referents unless the content clearly dictates otherwise. Thus, for example, reference to "a circuit" can include a combination of two or more circuits, and the like.

Unless defined otherwise, all technical and scientific terms used herein have the same meaning as commonly understood by one of ordinary skill in the art to which the invention pertains. Although many methods and materials similar, modified, or equivalent to those described herein can be used in the practice of the present invention without undue experimentation, the preferred materials and methods are described herein. In describing and claiming the present invention, the following terminology will be used in accordance with the definitions set out below.

Elements are often referred to herein according to the standard periodic table of the elements. For example, Pt for platinum, Au for gold, Al for aluminum, Ru for ruthenium, Sc for scandium, Bi for bismuth, Ce for cerium, Yb for ytterbium, Er for erbium, Mn for manganese, Ti for titanium, and Lu for lutetium.

As used herein, "valence" refers to the ability of an atom of an element to combine with other atoms measured by the number of electrons which the atom will give, take, and/or share to form, e.g., a crystal lattice or chemical compound.

A "ferroelectric material", as used herein refers to a material with ions, wherein the material can exhibit a dipole moment. For example, a ferroelectric material can be a material with crystals having the formulation (Y1-x Ax)(Mn1-yBy)O3, where "A" can be a metal having a valence of 3, and "B" can be a metal with a valence of 4 or 3, and which exhibits a dipole moment or can be induced to exhibit a dipole moment.

A "crystal", as used herein, refers to a solid in which the constituent atoms, molecules, and/or ions are packed in a regularly ordered, repeating pattern of a lattice structure. Ferroelectric materials of the invention include crystals grown (crystallized) from constituents in the formulation layer to provide a unitary crystal structure and/or a polycrystalline solid material.

DETAILED DESCRIPTION

Figure 1:
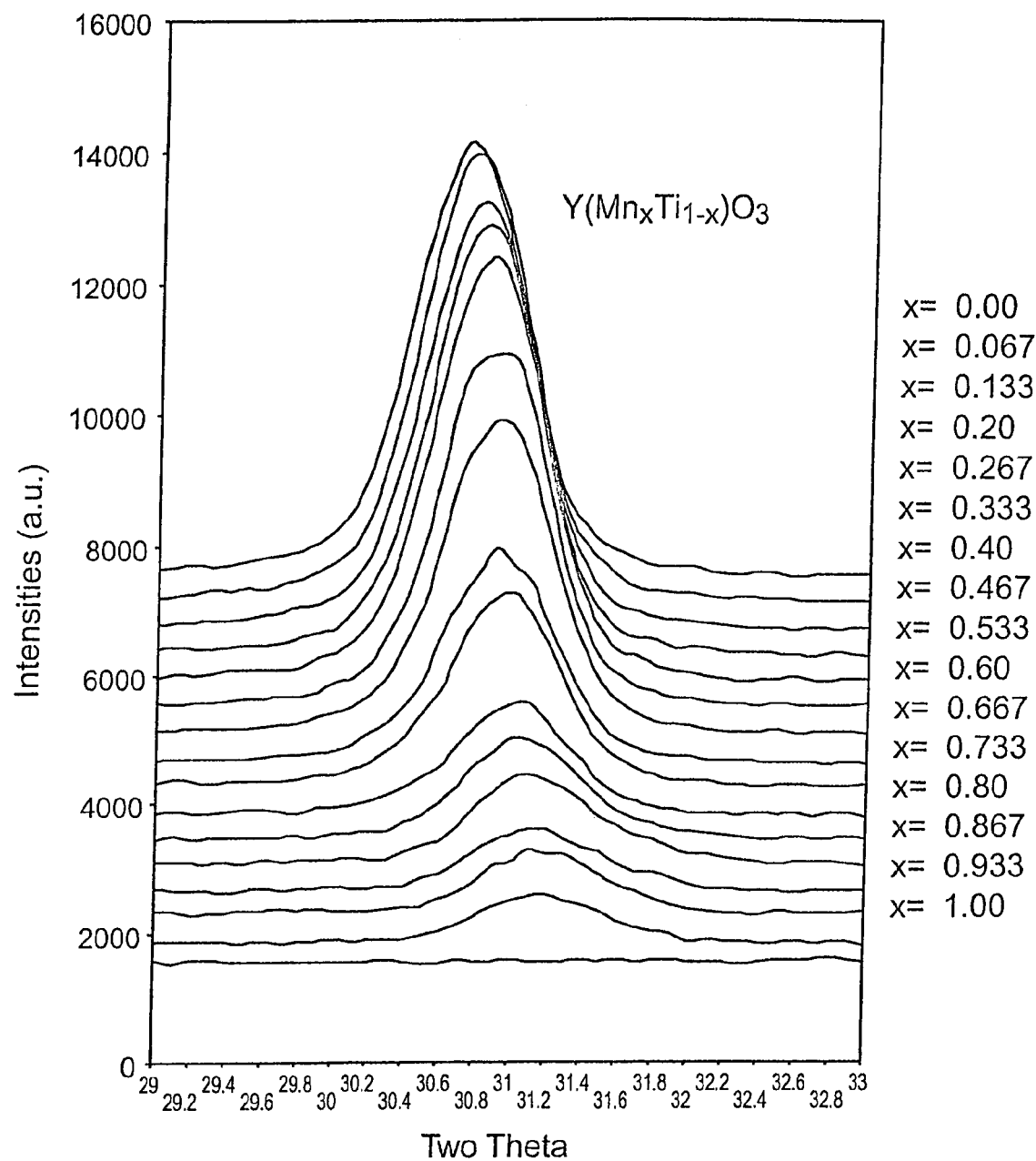
FIG. 1 shows a chart of theta-2 theta x-ray diffraction patterns for $Y(Mn_xTi_{1-x})O_3$ wherein x=0, 0.067, 0.133, 0.20, 0.267, 0.333, 0.40, 0.466, 0.533, 0.60, 0.667, 0.733, 0.80, 0.867, 0.933, and 1.00. The sample analyzed is a thin film deposited by combinatorial ion-beam sputtering deposition on a Pt electroded silicon substrate to form a continuous concentration x change from 0 to 1.

The present invention includes ferroelectric materials and methods of their preparation. The ferroelectric materials include, e.g., crystalline compositions having the formulation: $(Y_{1-x}A_x)(Mn_{1-y}B_y)O_3$, where A can be a metal having a valence of 3, and B can be a metal with a valence of 4 or 3. Methods of manufacturing the ferroelectric materials include, for example, forming one or more layers containing yttrium, manganese, and titanium on a substrate, heating the layers in the presence of a low pressure atmosphere containing oxygen to crystallize the layers on the substrate. The ferroelectric material can have characteristics useful in semiconductor devices, such as non-volatile memory chips.

Ferroelectric Materials

Ferroelectric materials of the invention can generally be described by, e.g., the formula: $(Y_{1-x}A_x)(Mn_{1-y}B_y)O_3$, wherein A is a metal having a valence of 3 with $0<x<1$, and B comprises a metal having a valence of 3 or 4 with $0<y<1$. The constituents of the formula can be grown as oriented crystals having useful ferroelectric properties. The ferroelectric materials can be part of a semiconductor chip, such as a nonvolatile memory chip.

In some embodiments, the "A" metal can be, e.g., any one of the rare-earth metals that can provide a valence of 3 in a crystal structure of the ferroelectric material. In certain embodiments, the "A" Metal can be, e.g., a rare-earth metal, Sc, Bi, Ce, Yb, Er, and/or Lu. The proportion of "A" metal to total Y+A can range from about 100% to about 0% (i.e., $0<x<1$), on a molar basis. In many embodiments of the ferroelectric material, the "A" metal can be near 0%.

Embodiments of the formula can include replacement of manganese with varying amounts of one or more "B" metals. The "B" metal can be any metal that can provide a valence of 3 or 4 in a crystal structure of the ferroelectric material. For example, the "B" metal can be Ti, Cr, and/or V. The proportion of "B" metal relative to Mn can range from about 0% to about 100% (i.e., $0<y<1$), on a molar basis. In many embodiments of the ferroelectric material, the molar amount "B" metal can be nearly equivalent to the molar amount of Mn (manganese) in the formulation. In some embodiments, the molar proportion of "B" metal to total Mn+B in the formulation ranges from about 0.1 to about 1.0 (or $0.1<y<1$). In certain embodiments, the molar proportion of "B" metal to total Mn+B in the formulation ranges from about 0.35 to about 0.65 (or $0.35<y<0.65$). In many embodiments, the "B" metal is Ti (titanium).

In some embodiments of the invention, the formulation for the ferroelectric material is $Y(Mn_{1-y}Ti_y)O_3$ on a molar basis, wherein y is between zero and about 1. In certain embodiments the formulation is $Y(Mn_{1-y}Ti_y)O_3$ with y ranging from about 0.005 to about 0.95, or from about 0.35 to about 0.65. In one embodiment, the formulation is $Y(Mn_{0.35}Ti_{0.65})O_3$.

The ferroelectric materials of the invention can have a remnant polarization (Pr), e.g., suitable to provide adequate retention in a nonvolatile memory device. For example, the ferroelectric material can be fabricated into a memory location on a semiconductor chip. When a field (write signal) is applied at the location, unit cells in the material can be polarized into a readable common electromagnetic alignment that is stable for a time period, e.g., long enough to be retrieved (read) as a data bit from the memory location. The remnant polarization of the ferroelectric materials can usefully range, e.g., from about 1 $\mu C/cm^2$ to more than about 30 $\mu C/cm^2$, or from about 10 $\mu C/cm^2$ to about 20 $\mu C/cm^2$.

The ferroelectric materials of the invention can have a dielectric constants suitable for structures in certain devices such as memory cores, MFIS, FE capacitors, and the like. In many embodiments, the materials have a dielectric constant ranging from about 1 to 100, or from about 5 to about 50.

In one aspect of the invention, the ferroelectric material is a component of a semiconductor chip, such as, e.g., a ferroelectric rapid access memory (FeRAM). For example, the ferroelectric materials of the invention can be used in ferromagnetic cores or ferroelectric capacitors in FeRAMs. Such cores or capacitors can be arranged, e.g., in arrays.

Methods of Preparing Ferroelectric Material

Methods of preparing the ferroelectric materials of the invention can include, e.g., forming one or more formulation layers comprising of yttrium, manganese, and a "B" metal on a substrate; and heating the substrate in a low pressure atmosphere containing oxygen so that a functional ferroelectric material grows on the substrate. For example, a ferroelectric material can be prepared by forming the one or more layers on electroded silicon substrate, heating the substrate to a temperature ranging from about 600° C. to about 800° C., and providing a low pressure atmosphere with some oxygen to grow crystals of ferroelectric material, e.g., as a thin film on the substrate. Typically, the crystallized layers of fenroelectric material are annealed in a lower pressure atmosphere, e.g., to stabilize the crystals and improve their function.

Forming the layers can be by any method known in the art, such as, e.g., ion beam deposition (IBD), atomic layer deposition (ALD), magnetron sputtering, pulsed laser deposition (PLD), electron beam deposition (ED), solution deposition methods, metal organic chemical vapor deposition (MOCVD), and/or the like, to provide a formulated layer with stoichiometric amounts corresponding to the formula. The layers can be formed as separate homogenous layers, or as a mixed layer of formulation constituents (e.g., Y, Mn, Ti, and/or their oxides). For example, a single layer with mixed desired proportions of constituents can be prepared by stoichiometrically sputtering the constituents from targets onto substrates using, e.g., ion beam sputtering, magnetron sputtering, or PLD. Formulation layers of mixed composition can also be prepared by the MBE or CVD sputtering methods using elemental sources or targets. In a typical embodiment, ion beam deposition composition of desired Y/Mn/Ti ratio is sputtered onto a substrate. Typically, constituents of the formulations in the layers are sputtered from highly pure targets in very clean environments, (i.e., free from non-formulation elements).

The layers can be formed on any of the variety of substrate known in the art, such as, e.g, Si, Ge, GaAs, GaN, Al2O3, SiC AlN, etc. The substrate can include an electrode surface made from a relatively inert metal, such as platinum (Pt), preferably not readily oxidized under the conditions of the method. It is envisioned that ferroelectric materials of the invention can be formed on oxide buffer layers of substrates.

The formulation layers and resultant ferroelectric materials are typically formed as thin films. The thin films can range in thickness from about 100 Å to about 5000 Å, or more typically, from about 500 Å to about 3000 Å.

The formulation layers can be formed, e.g., as a thin film that provides the metal constituents of the desired material formulation in the correct molar proportions. For example, layers to prepare the formulation $Y(Mn_{0.35}Ti_{0.65})O_3$ can include layers having one part yttrium, 0.35 parts manganese, and 0.65 parts of titanium in stoichiometric proportions through the one or more layers. It has been found that the presence of Ti in the formulation can lower the optimum crystal growing temperature and tends to promote epitaxial growth in the desired orientation.

The formulated layer can be retained in a temperature controlled environment for crystal growth, and annealing. For example, the substrate with layers can be heated in an oven controllable at temperatures ranging from about 500° C. to about 1500° C. In a typical process for preparing the ferroelectric material, the oven (and/or film deposition system) provides temperatures ranging from about 400° C. to about 800° C. for crystallizing, and/or annealing the material.

The pressure and composition of the atmosphere in the oven (and/or film deposition system) during crystallization of the ferroelectric material should be well controlled. A typical pressure of the atmosphere in contact with the layers during crystallizing, and/or annealing is less than about $10^{-3}$ torr, less than about $10^{-4}$ torr, less than about $10^{-5}$ torr, less than about $10^{-6}$ torr, or less than about $10^{-7}$ torr. The low pressure atmosphere can be substantially made up of oxygen, or optionally include a certain proportion of other gasses, such as inert gasses. In one embodiment, the low pressure atmosphere includes a noble gas, such as argon, in defined proportions with oxygen gas ($O_2$). For example, the low pressure atmosphere during crystallization can consist essentially of argon gas and oxygen gas in proportions ranging from about 10 to 1, to about 1 to 10, respectively. In typical examples, the atmosphere contains an argon to oxygen gas ratio ($Ar:O_2$) of from about 2 to one, to about 1 to 2. In one embodiment, the atmosphere for crystallization is an atmosphere of about $6 \times 10^{-4}$ torr and an $Ar:O_2$ ratio of about 1:2.

Epitaxial growth orientation of the ferroelectric material can be important in many embodiments. Factors that can affect the orientation of crystal growth can include, e.g., the formulation, the type of substrate, the growth temperature, the presence of impurities, the atmospheric pressure, the partial pressure of oxygen in the atmosphere, annealing temperatures, and the like. Good epitaxial growth of oriented thin films can be obtained, e.g., with the $Y(Mn_yTi_{1-y})O_3$ formulations at relatively low temperatures (e.g., between about 500° C. and 700° C.), on a substrate electroded with Pt.

Annealing the crystallized layer of ferroelectric material can improve functional characteristics of the material. After the initial crystal growth phase, the atmosphere can be reduced to a high vacuum, e.g., of about $10^{-6}$ torr, to about $10^{-7}$ torr, or less. Annealing temperatures can be empirically optimized for each material, for example, between about 400° C. and about 800° C., or from about 500° C. to about 600° C. Annealing times can range from about 1 hour to about 100 hours, or from about 2 hours to about 10 hours. In one embodiment, annealing of a ferroelectric material thin film takes place annealed in a vacuum of $1 \times 10^{-6}$ torr at 660° C. for 1 hour.

Many formulations of the invention can be processed at relatively low temperatures compatible with common semiconductor components. This can allow manufacture of semiconductor chips, such as FeRAMs, that include standard circuitry in functional contact with the ferroelectric materials of the invention. For example, doped silicon semiconductor contacts, traces, diodes, transistors, and the like, can be fabricated onto the substrate before, during, and/or after the steps of preparing the ferroelectric materials. Sputtering of formulation layers can be, e.g., through a mask to accurately locate the ferroelectric materials relative to the standard circuitry. Matrixed circuit arrays in functional contact with multiple ferroelectric components can provide memory chips with large amounts of addressable nonvolatile memory.

EXAMPLES

The following examples are offered to illustrate, but not to limit the claimed invention.

Preparation and Analysis of Libraries Having a Range of Mn/B Ratios

Several libraries including $Y(Mn_{1-x}Ti_x)O_3$, $Y(Mn_{1-x}V_x)O_3$, and $Y(Mn_{1-x}Cr_x)O_3$ were successfully synthesized on substrates using a combinatorial ion beam deposition system. Each library had a fixed layer thickness ratio of Y to (Mn+B), wherein B=Ti, V, or Cr. Mn and B layers had a gradient thickness profile in opposite directions along the substrate with the total thickness of Mn+B layer being constant at any point along the substrate. Thicknesses of these thin film compositions were controlled using an in-situ thickness monitor. The thickness ratios between Y, Mn, and B determined the final composition at any particular point in the library. With Y thickness held constant, and opposite thickness gradients of Mn and B along the substrate, a continuously changing binary phase material library from $YMnO_3$ to $YTiO_3$ was obtained. A set of Y/Mn/B multilayers (B=Ti, V, or Cr) were each prepared ~10 times to allow corroborating and statistical analyses. Multilayers with ~1500 Å total thickness were sputtered onto 700 Å Pt layers, previously deposited onto (111) Si substrates, to simulate typical manufacturing conditions used for actual memory devices. Each library was annealed at 450° C. for 80 hours before firing at 870° C. for 3 hours. Microbeam XRD with 100 μm beam size was used to scan selected points along the library having Mn/B ratios of interest. Fine (0004) peak XRD scans of the $Y(Mn_{1-x}Ti_x)O_3$ library are shown in FIG. 1. In this experiment, only $Y(Mn_{1-x}Ti_x)O_3$ showed substantial structural phases with oriented growth, and not the Mn/V and Mn/Cr materials. Ti was able to replace Mn at any ratio while maintaining the same hexagonal structure with (0004) preferred orientation. The data indicate that increased substitution of Mn with Ti tended to increase the preferred orientation growth along (0004) on Pt deposited (111) Si substrate.

Figure 2:
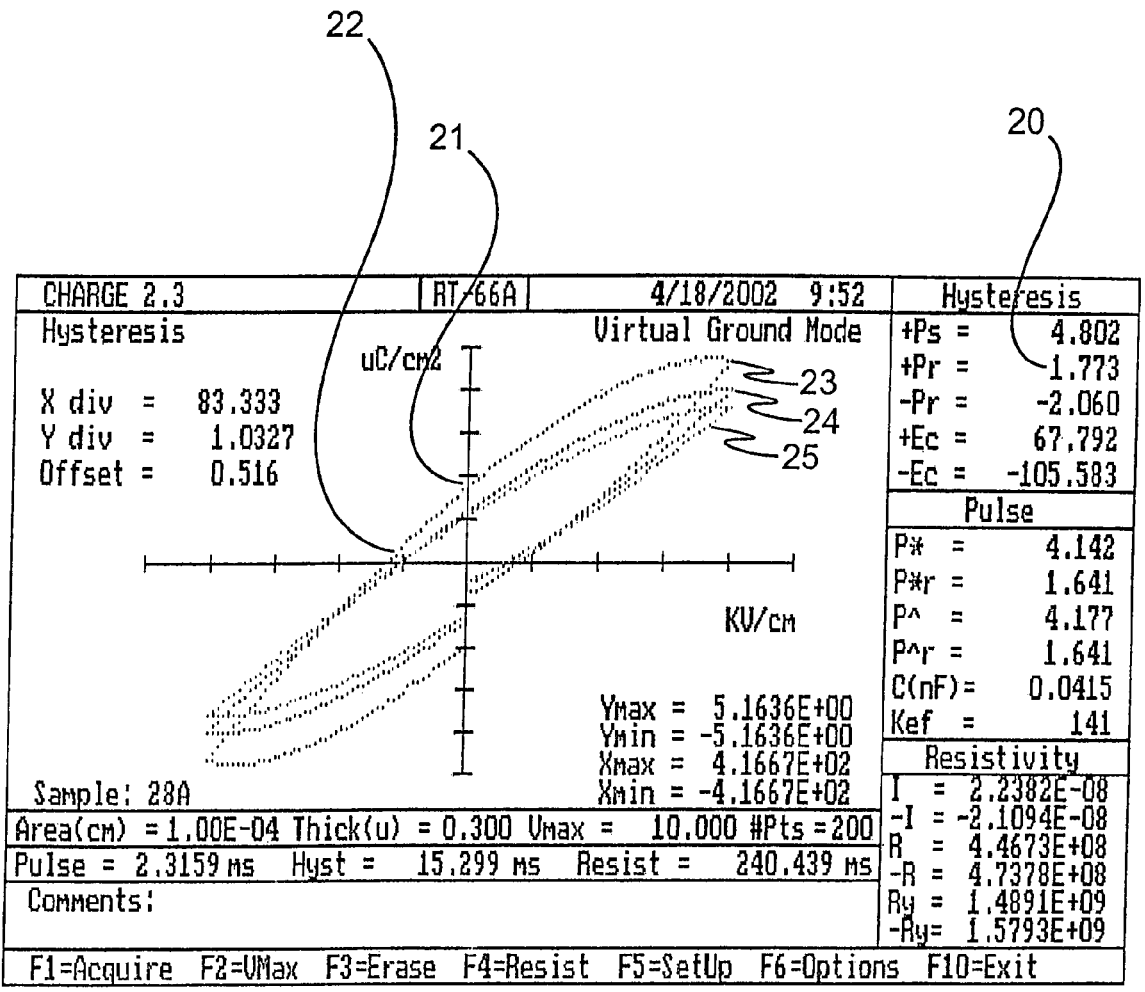
FIG. 2 shows P-E hysteresis loops measured for $Y(Mn_xTi_{1-x})O_3$ with x=0.4, 0.45, and 0.50. The sample analyzed is a thin film deposited by combinatorial ion-beam sputtering deposition on a Pt electroded silicon substrate to form a continuous concentration x change from 0 to 1.

Among the libraries in this example, $Y(Mn_{1-x}Ti_x)O_3$ showed the most promising potential for ferroelectric character. FIG. 2 shows P-E hysteresis loops measured for $Y(Mn_xTi_{1-x})O_3$ with x=0.4 (23), 0.45 (24), and 0.5 (25). The sample is a thin film with a continuous concentration x change from 0 to 1 deposited by combinatorial ion-beam sputtering deposition on a Pt electroded silicon substrate. Note the significant remnant polarization (Pr) 20, retentivity 21, and coercivity 22 of these $Y(Mn_{1-x}Ti_x)O_3$ materials (presented data are for the x=0.5 sample).

Analyses of Bulk Samples

Figure 3:
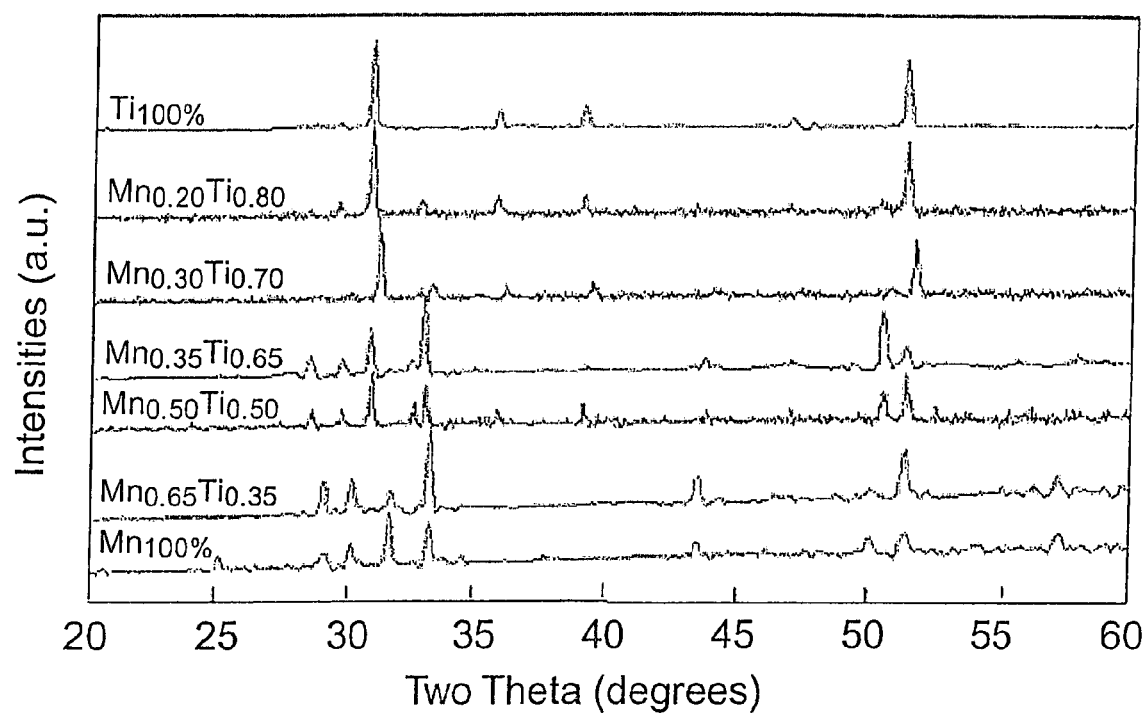
FIG. 3 shows theta-2 theta x-ray diffraction patterns for a series of bulk ceramic $Y(Mn_xTi_{1-x})O_3$ samples prepared by conventional sintering process with x=0, 0.2, 0.3, 0.35, 0.5, 0.65, and 1.

A series of $Y(Mn_xTi_{1-x})O_3$ bulk samples were prepared, wherein x=0, 0.2, 0.3, 0.35, 0.5, 0.65, and 1, in order to confirm the result obtained for the combinatorial thin film library (above). The bulk ceramic samples were made by conventional ceramic processing techniques, as follows. High purity $Y_2O_3$, $MnO_2$, and $TiO_2$ powders were ball-milled, calcinated at 1150° C. for 12 hours, and sintered at 1300° C. for 12 hours, to form fused ceramic materials having the desired Mn/Ti ratios. The XRD patterns shown in FIG. 3 confirm that Ti can substitute Mn up to 65% while maintaining a pure hexagonal phase. It is notable that $Y(Mn_{0.1}Ti_{0.9})O_3$ and $YTiO_3$ have XRD patterns different from lower Ti proportion materials, but consistent with a $Y_2Ti_2O_7$ cubic structure.

Figure 4:
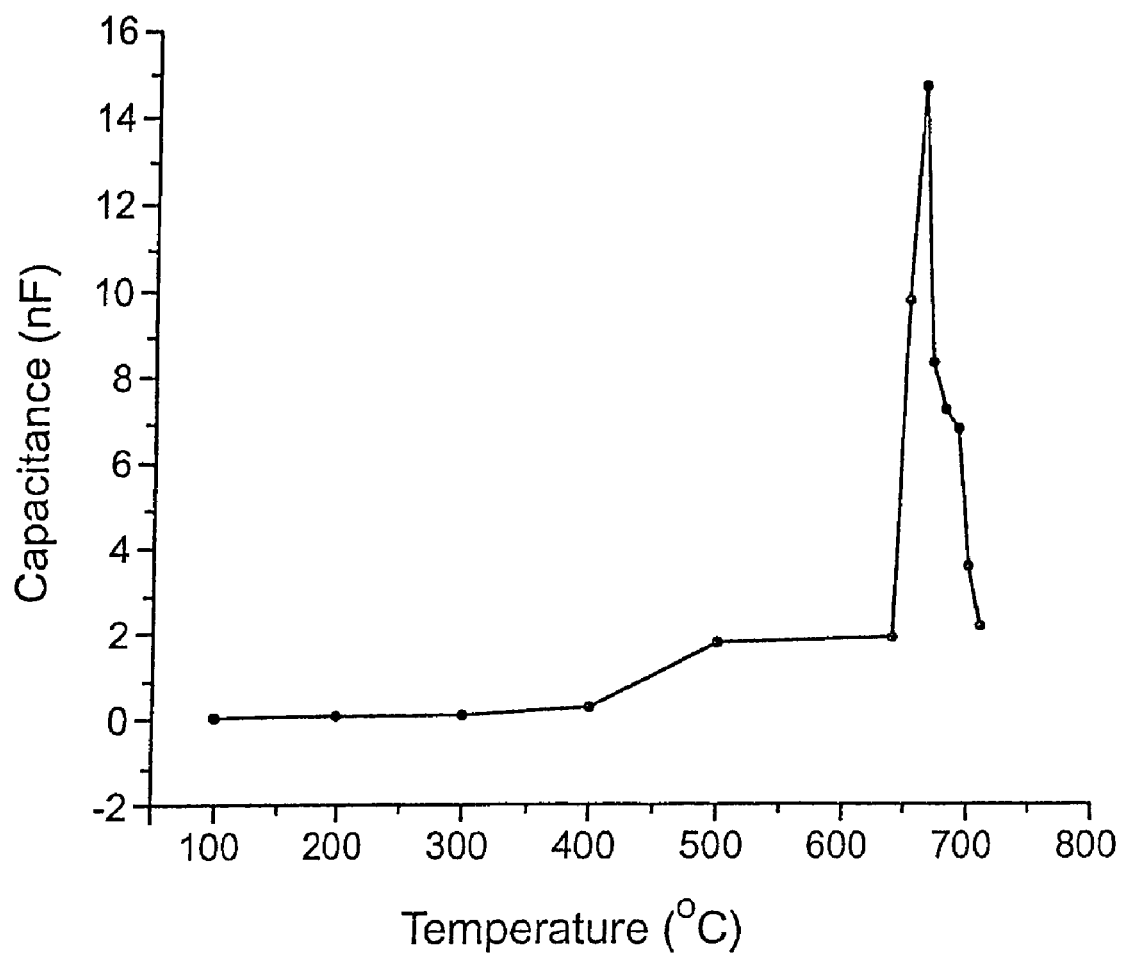
FIG. 4 shows a chart of Curie-temperature detection for $Y(Mn_{0.5}Ti_{0.5})O_3$ bulk ceramic sample prepared by a conventional sintering process.

The series of bulk ceramic samples were polished down to the thickness of about 1 mm and tested for ferroelectric properties. Ferroelectric hysteresis loops were measured on these samples, but confirmation of ferroelectric properties was inconclusive possibly due to leakiness of the samples and/or random orientation of crystals in the ceramic samples. However, Curie temperature measurements provided an alternate method to confirm ferroelectricity in a sample of $Y(Mn_{0.5}Ti_{0.5})O_3$. Capacitance as a function of temperature was measured using parallel plate geometry to detect a Curie temperature transition, as shown in FIG. 4. In this experiment, the peak capacitance near 680° C. clearly demonstrates a characteristic transition from ferroelectricity to paraelectricity for this material.

Effects of Oxygen Pressure on the Ferroelectric Materials

Figure 5:
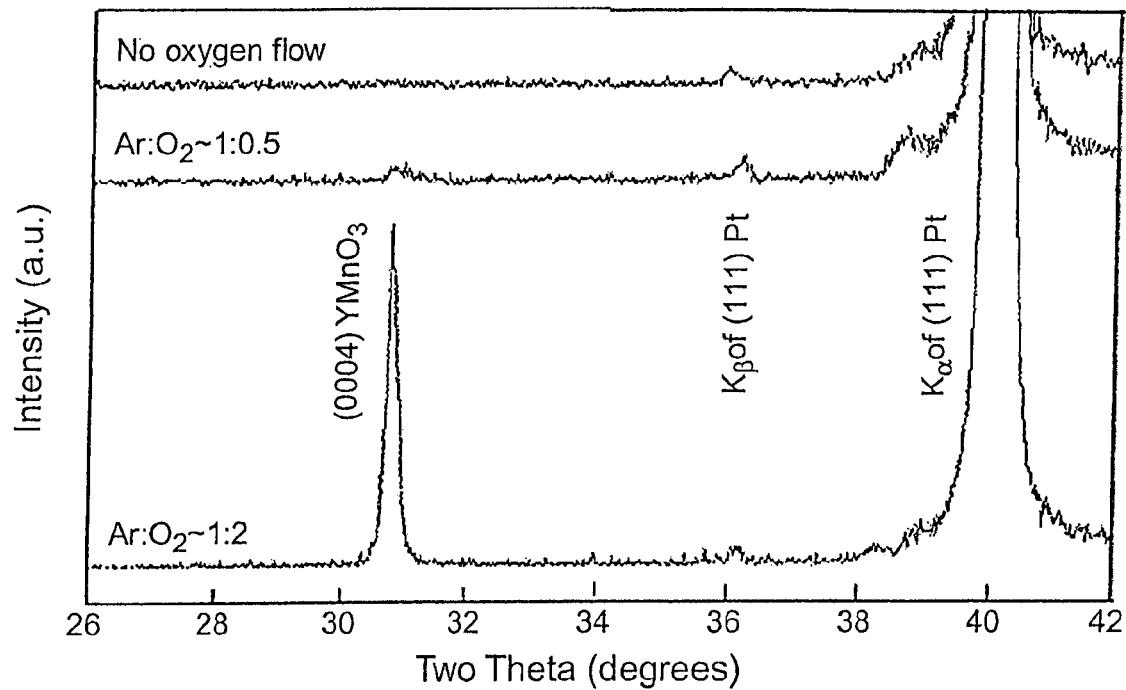
FIG. 5 shows a chart of theta-2 theta x-ray diffraction patterns for $Y(Mn_{0.35}Ti_{0.65})O_3$ thin films grown at 660° C. under different oxygen pressures by ion beam sputtering deposition.

Y(Mn$_{0.5}$Ti$_{0.5}$)O$_3$ and Y(Mn$_{0.35}$Ti$_{0.65}$)O$_3$ targets were prepared by the same method discussed above for fabrication of thin film compositions. An ion beam sputtering system was used to grow thin films in-situ on 2000 Å Pt coated (111) Si substrates. Typical sputtering conditions included a 10$^{-7}$ torr base pressure, 6×10$^{-4}$ torr Ar—O$^2$ mixed gas pressure, and a DC ion source power set to 33 mA at 1000V. The substrate temperature, oxygen partial pressure, and post annealing were optimized for the deposition. High quality thin films with (0004) preferred orientation growth were obtained for Y(Mn$_{0.35}$Ti$_{0.65}$)O$_3$ and Y(Mn$_{0.5}$Ti$_{0.5}$)O$_3$. FIG. 5 shows the XRD patterns of Y(Mn$_{0.35}$Ti$_{0.65}$)O$_3$ thin films grown by ion beam sputtering deposition under three different oxygen pressures.

Oxygen pressure parameters were found to be very important for promoting the formation of high quality film. If the oxygen partial pressure is too low, the desired (0004) XRD peak does not appear, even at substrate temperature of 650° C., and above. For example, FIG. 5 shows no XRD peak for Y(Mn$_{0.35}$Ti$_{0.65}$)O$_3$ thin films grown in the absence of oxygen and only a weak peak for the film grown in an atmosphere of 1:0.5 Ar to O$_2$.

Figure 6:
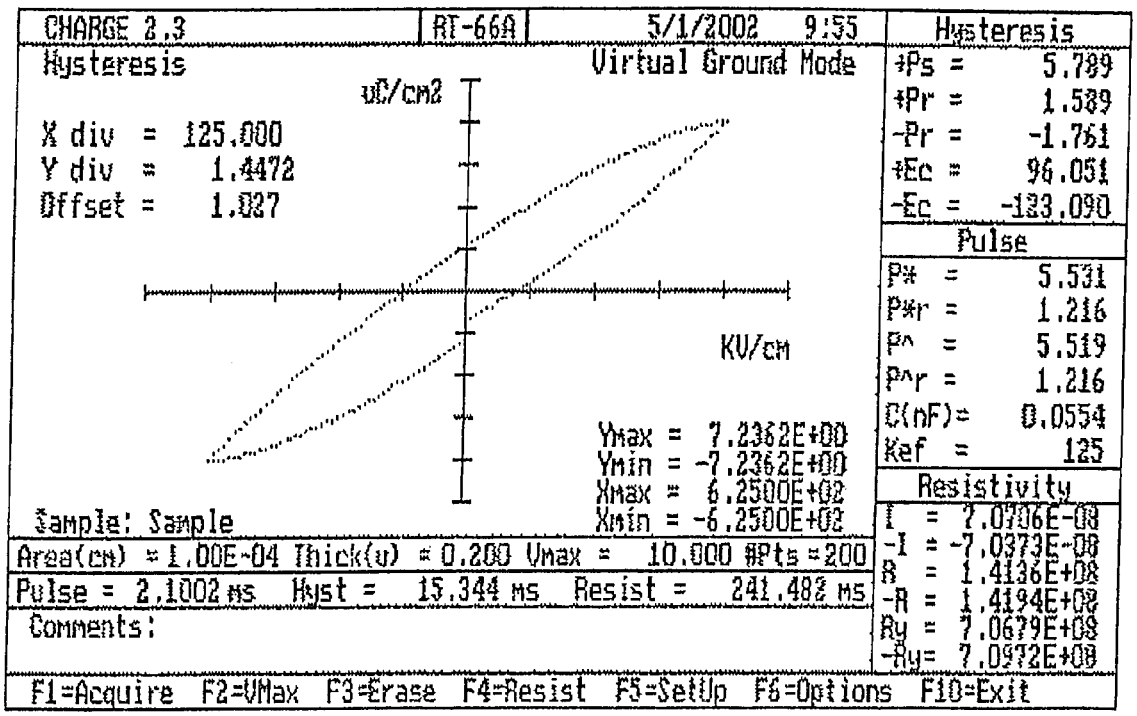
FIG. 6 shows a P-E hysteresis loop of $Y(Mn_{0.35}Ti_{0.65})O_3$ thin film (250 nm thick) measured by Radiant RT66A. The film was grown by ion beam sputtering, and the growth temperature is 660° C. with Ar/O2=1:2 (partial pressure ratio). The film was post-annealed in high vacuum ($1 \times 10^{-6}$) at 660° C. for 1 hour.

The P-E loop measured for the film grown in 1:2 Ar to O$_2$, using Rt-66A (Radiant Technologies) shows significant ferroelectric properties. FIG. 6 is the result of measurement for Y(Mn$_{0.35}$Ti$_{0.65}$)O$_3$ showing a remnant polarization (Pr) of about 1.589 for this film. Since the film shows a little bit of leakage, the P-E loop doesn't show saturation of the polarization. But the intrinsic material property of ferroelectricity is evidenced by the existence of remnant polarization.

Effects of Mn/Ti Ratios on the Ferroelectric Materials

Figure 7:
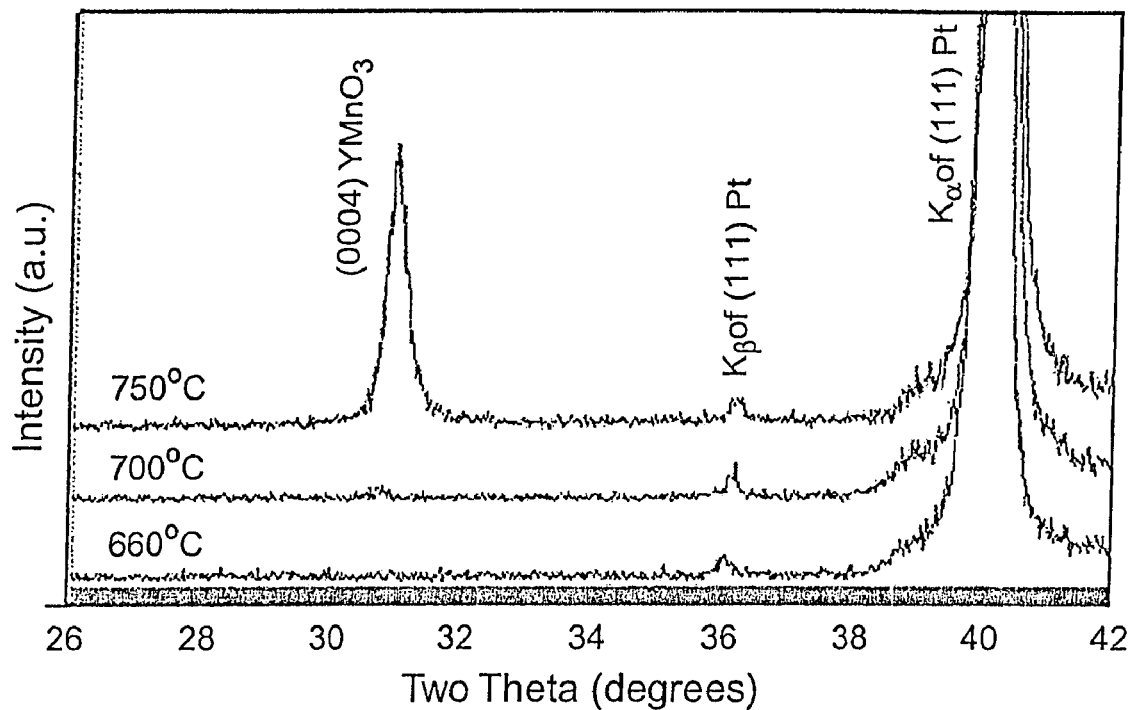
FIG. 7 shows X-ray diffraction patterns of $Y(Mn_{0.5}Ti_{0.5})O_3$ film grown at different substrate temperatures with $Ar/O_2$ at a 1:2 ratio.
Figure 8:
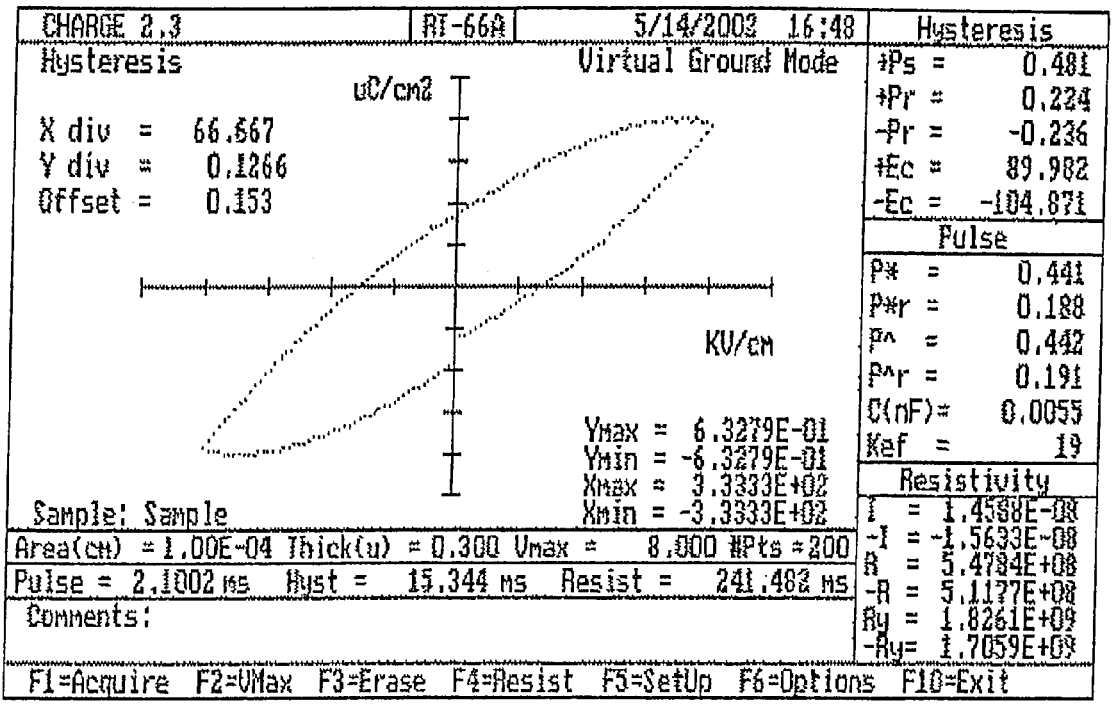
FIG. 8 shows a P-E hysteresis loop of $Y(Mn_{0.35}Ti_{0.65})O_3$ thin film (250 nm) measured by Radiant RT66A The film was grown by ion beam sputtering, and the growth temperature was 750° C. The film is post-annealed in high vacuum ($1 \times 10^{-6}$) at 750° C. for 1 hour.
Figure 9:
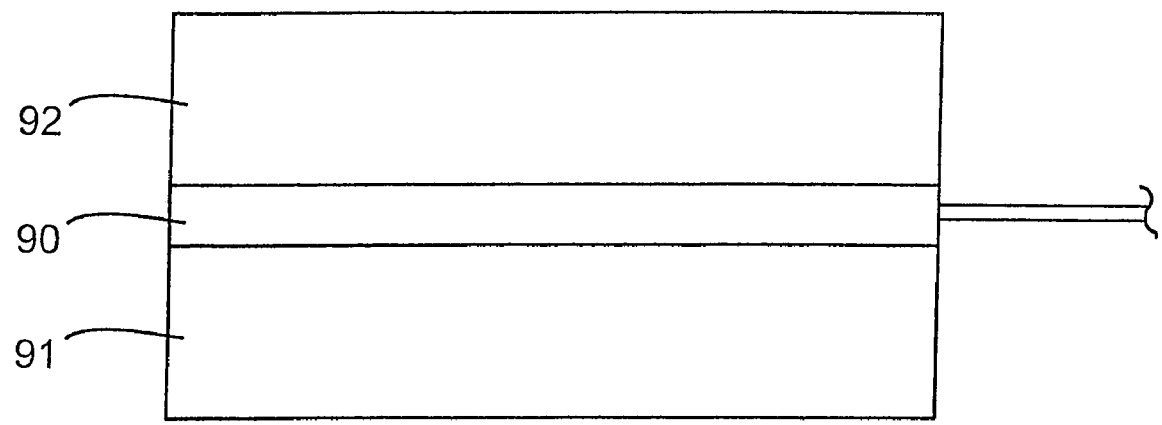
FIG. 9 shows a schematic diagram of a three-layered structure.

Experiments were carried out to determine the effects of Mn/Ti ratios on thin film characteristics. FIG. 7 shows the X-ray diffraction patterns of a Y(Mn$_{0.5}$Ti$_{0.5}$)O$_3$ film grown at 3 different substrate temperatures. It was found that the optimized substrate temperature to obtain oriented film growth is higher than for the Y(Mn$_{0.35}$Ti$_{0.65}$)O$_3$ film, suggesting that higher proportions of Ti can be helpful in lowering the thermal requirement for crystallization of the composition. For example, at substrate temperatures as low as 650° C., highly (0004) oriented thin films are obtained for Y(Mn$_{35}$Ti$_{65}$)O$_3$, without other significant XRD peaks. However, for Y(Mn$_{0.5}$Ti$_{0.5}$)O$_3$ thin film, a higher substrate temperature of 750° C. was required for highly (0004) oriented thin film growth. FIG. 8 shows a P-E loop for the Y(Mn$_{0.5}$Ti$_{0.5}$)O$_3$ thin film grown at 750° C. The remnant polarization (Pr) is 0.224. The film again exhibits leakage and the saturation of polarization is not observed.

Growth of ferroelectric materials at temperatures ranging around 650° C., or less, can enhance the compatibility of the rare earth manganese-titanium oxide manufacturing processes with other manufacturing processes. This is an important result, e.g., allowing incorporation of Y(Mn$_x$Ti$_{1-x}$)O$_3$ elements into many standard silicon semiconductor designs.

It is understood that the examples and embodiments described herein are for illustrative purposes only and that various modifications or changes in light thereof will be suggested to persons skilled in the art and are to be included within the spirit and purview of this application and scope of the appended claims.

While the foregoing invention has been described in some detail for purposes of clarity and understanding, it will be clear to one skilled in the art from a reading of this disclosure that various changes in form and detail can be made without departing from the true scope of the invention. For example, many of the compositions and methods described above can be used in various combinations.

All publications, patents, patent applications, and/or other documents cited in this application are incorporated by reference in their entirety for all purposes to the same extent as if each individual publication, patent, patent application, and/or other document were individually indicated to be incorporated by reference for all purposes.

What is claimed is:

1. A method of preparing a ferroelectric material, said method comprising:
   forming one or more layers on a substrate, the one or more layers comprising: Y, A, Mn, and B in a proportion according to the formula (Y$_{1-x}$A$_x$)(Mn$_{1-y}$B$_y$), wherein A comprises a metal having a valence of 3 and 0<x<1, and B comprises a metal having a valence of 4 or 3 and 0<y<1;
   heating the layers to a temperature ranging from about 600° C. to about 800° C.; and,
   providing an atmosphere comprising oxygen, said atmosphere having a pressure of less than 10$^{-3}$ torr;
   crystallizing the layers in the atmosphere at the temperature to form the ferroelectric material.

2. The method of claim 1, wherein said forming layers comprises: ion beam sputtering, magnetron sputtering, pulsed laser deposition (PLD), MOCVD, MBE or EB.

3. The method of claim 1, wherein the substrate comprises: Si, Ge, GaAs, GaN, Al$_2$O$_3$, SiC or AlN.

4. The method of claim 1, wherein the B metal comprises: Ti, Cr or V.

5. The method of claim 1, wherein the temperature comprises about 650° C. or less.

6. The method of claim 1, wherein the atmosphere further comprises an inert gas.

7. The method of claim 6, wherein the atmosphere comprises argon (Ar) and oxygen (O$_2$) in a ratio less than 1:1.

8. The method of claim 6, wherein the atmosphere comprises a pressure of 10$^{-4}$ torr or less.

9. The method of claim 1, further comprising depositing a Pt electrode on the substrate before forming the one or more layers.

10. The method of claim 1, wherein the ferroelectric material crystallizes epitaxially in an orientation of (0004).

11. The method of claim 1, wherein the ferroelectric material has the formula Y(Mn$_{1-y}$Ti$_y$)O$_3$ wherein y ranges from about 0.005 to about 1.

12. The method of claim 1, wherein y ranges from about 0.35 to about 0.65.

13. The method of claim 1, further comprising post-annealing the crystallized layers in vacuum of about 10$^{-6}$ torr or less.

14. The method of claim 1, wherein the atmosphere has a pressure of less than 10$^{-3}$ torr.

15. The method of claim 1, wherein said crystallization takes place in the atmosphere having a pressure of about 10$^{-3}$ torr or less and at the temperature ranging from about 600° C. to about 800° C.

16. The method of claim 1, wherein the layers are not heated to above 650° C.

17. The method of claim 1, further comprising holding the temperature in the range for at least an hour.

18. The method of claim 1, wherein said heating the layers is accomplished by heating the substrate.

* * * * *